(12) United States Patent
Shikina et al.

(10) Patent No.: US 8,491,139 B2
(45) Date of Patent: Jul. 23, 2013

(54) DISPLAY APPARATUS

(75) Inventors: Noriyuki Shikina, Ichihara (JP);
Ryuichiro Isobe, Chiba (JP); Hiroyuki Kitayama, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 891 days.

(21) Appl. No.: 12/473,111

(22) Filed: May 27, 2009

(65) Prior Publication Data

US 2009/0296366 A1  Dec. 3, 2009

(30) Foreign Application Priority Data

May 29, 2008  (JP) .................. 2008-141058

(51) Int. Cl.
*F21V 13/08*  (2006.01)
*F21V 9/14*  (2006.01)

(52) U.S. Cl.
USPC .............. 362/19; 362/235; 313/501; 313/504

(58) Field of Classification Search
USPC ............... 313/500–512; 362/19, 235
See application file for complete search history.

(56) References Cited

U.S. PATENT DOCUMENTS

| 2002/0043931 | A1 | 4/2002 | Minoura et al. | |
|---|---|---|---|---|
| 2003/0034938 | A1 | 2/2003 | Yamada | |
| 2005/0099113 | A1 | 5/2005 | Yamada | |
| 2005/0162593 | A1* | 7/2005 | Miyachi | 349/119 |
| 2006/0192220 | A1* | 8/2006 | Nishikawa et al. | 257/98 |
| 2008/0074859 | A1* | 3/2008 | Kitayama et al. | 362/19 |
| 2008/0094528 | A1* | 4/2008 | Robinson et al. | 349/1 |
| 2008/0285125 | A1* | 11/2008 | Lee et al. | 359/449 |
| 2009/0085478 | A1* | 4/2009 | Cok et al. | 313/506 |

FOREIGN PATENT DOCUMENTS

KR  10-0706730 A  4/2007

* cited by examiner

*Primary Examiner* — Anh Mai
*Assistant Examiner* — Elmito Breval
(74) *Attorney, Agent, or Firm* — Canon U.S.A., Inc. IP Division

(57) ABSTRACT

A member configured to absorb a predetermined wavelength range for light having an incident angle is located on the first electrode side of a light emitting device and settings are made so that the hue of light emitted in a direction having an angle with respect to the front becomes yellow when the light emitting device emits white light.

6 Claims, 20 Drawing Sheets

DISPLAY APPARATUS

BACKGROUND OF THE INVENTION

1. Field of the Invention

The present invention relates to a display apparatus including a plurality of light emitting device groups, where each of the groups includes a plurality of light emitting devices emitting lights different in color from each other. For example, the present invention relates to a display apparatus including a plurality of light emitting device groups, where each of the groups includes a plurality of organic light emitting devices.

2. Description of the Related Art

The organic light emitting device ((organic electroluminescence device) hereinafter often referred to as a "device") is now being studied and developed. The above-described organic light emitting device includes a pair of electrodes including an anode and a cathode, and a plurality of organic compound layers including a light emitting layer, which is provided or located between the pair of electrodes. Each of the organic compound layers has a thickness of about a several tens of nm, and a reflection plane including a layer such as an electrode is provided or located on each of both sides of the organic compound layer. When the reflection planes are provided, the optical interference effect, which means that light with a predetermined wavelength is vibrated and intensified inside the organic light emitting device, becomes noticeable. The light intensification achieved through the optical interference has been used to increase the color purity of light emitted from the organic light emitting device.

According to an organic electroluminescent element disclosed in United States Patent Application No. 20050099113, the optical path between the first electrode and a translucent reflection layer is set so that the peak wavelength of a spectrum for extraction satisfies the vibration condition for each of emitted light colors including red, green, and blue (refer to paragraphs [0019] to [0025]).

The above-described wavelength intensified through the optical interference (vibration wavelength) is determined based on the optical path between the plurality of reflection planes. However, when an angle in which the device is visually recognized (view angle) is increased, a vibration wavelength $\lambda$ is shifted to the short-wavelength side. In that case, the hue of the light emitting device is changed.

When the display apparatus is configured by using the above-described light emitting devices emitting lights with different colors as pixels, the hue of each of the pixels is changed when the pixels are viewed from a slanting direction so that the balance of the color mixture is also changed. Namely, a light emitting device showing a red color at the front shows an orange color depending on the view angle, a light emitting device showing a green color at the front shows a blue color depending on the view angle, and a light emitting device showing a blue color at the front shows a deep blue color depending on the view angle. Consequently, the hue of a white color which is expressed by the mixture of the red color, the green color, and the blue color (white balance) is lost. Since the white color is used to express the skin of a person, the misregistration of the white color, which is caused based on the view angle, deteriorates the display quality of the display apparatus.

Accordingly, a technology for handling the above-described problem is disclosed in United States Patent Application No. 20030034938. A display device disclosed in United States Patent Application No. 20030034938 reduces the white color misregistration occurring when the view angle is large by displacing the peak wavelength of the internal light emitting spectrum of a light emitting layer and that of a multiple interference filter spectrum obtained through a vibration part from each other. More specifically, the peak wavelength of the multiple interference filter spectrum is displaced by as much as +10 nm for a red-color device, +4 nm for a green-color device, and −10 nm for a blue-color device with respect to the peak wavelength of the internal light emitting spectrum so that the value of the white color misregistration becomes $\Delta uv=0.015$ or less at a view angle of 60 degrees (refer to paragraphs [0008] to [0009]).

However, even though the display device disclosed in United States Patent Application No. 20030034938 can reduce the white color misregistration occurring due to the view angle, the display device should be designed in consideration of the white color misregistration. Therefore, the purity of the colors of emitted light is often decreased due to the selection of light emitting materials. In that case, the color reproducing range is decreased so that the display property of the display apparatus is compromised.

On the other hand, when the purity of the colors of emitted light is increased to obtain a display apparatus having a wide color reproducing range, as is the case with the light emitting device disclosed in United States Patent Application No. 20050099113, the above-described misregistration of the color mixture (e.g., the white color) caused by the view angle occurs.

Therefore, the result of verifications of the color misregistration caused by the view angle, the verifications being performed by the inventors of the present invention, shows that color misregistration from the white color toward the yellow direction is highly tolerable for an observer.

SUMMARY OF THE INVENTION

Accordingly, the present invention allows for setting the peak wavelength of an interference spectrum as appropriate for achieving not only the reduction of the white color misregistration but also various targets such as increasing the color purity. Further, the present invention allows for reducing color misregistration recognized from a slanting direction. Still further, the present invention provides a display apparatus having a wide color reproducing range and an increased view angle property.

A display apparatus according to an embodiment of the present invention includes a plurality of light emitting device groups including light emitting devices emitting lights of different colors, wherein each of the light emitting devices includes a first electrode, a second electrode, a light emitting layer located between the first and second electrodes, and an optical path between a first reflection plane located near the first electrode and a second reflection plane located near the second electrode is set so that light emitted through the light emitting layer is resonated, wherein a member configured to absorb a predetermined wavelength range for light emitted in a direction having an angle with respect to a normal direction of the display apparatus is located on a light extracting side of the second electrode, and wherein the predetermined wavelength range is set so that the hue of light emitted in the direction having the angle becomes yellow when the light-emitting-device group emits white light.

Further features of the present invention will become apparent from the following description of exemplary embodiments with reference to the attached drawings.

DESCRIPTION OF THE EMBODIMENTS

Figure 1:
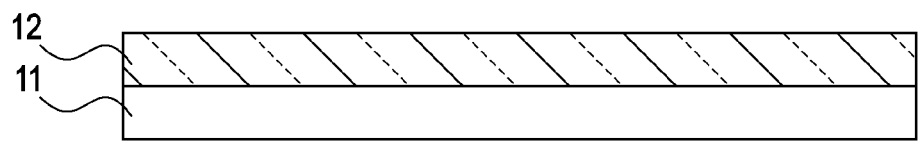
FIG. 1 is a schematic sectional view of a display apparatus according to an embodiment of the present invention.

A display apparatus according to an embodiment of the present invention includes a plurality of light-emitting-device groups including a plurality of light-emitting devices emitting lights of colors different from each other. Each of the light-emitting devices includes a first electrode, a second electrode which is translucent, and a light-emitting layer provided or located between the first and second electrodes.

The second electrode is provided to extract light emitted from the light-emitting layer. The direction in which the emitted light is extracted is referred to as a light extracting direction. The first electrode and the second electrode are provided or located on opposite sides of the light-emitting layer. When a voltage is applied between the first and second electrodes, the light-emitting layer provided or located between the electrodes emits light.

A reflection plane is provided or located near the first-electrode side rather than near the light-emitting layer and another reflection plane is provided or located near the second-electrode side rather than near the light-emitting layer, where each of the reflection planes is provided to resonate the light emitted from the light-emitting layer. The above-described reflection plane provided or located on the first-electrode side is determined to be the first reflection plane and that the reflection plane provided or located on the second-electrode side is determined to be the second reflection plane. According to an embodiment of the present invention, the above-described configuration is referred to as a resonator configuration. When the optical path between the above-described reflection planes is determined so that the light emitted from the light-emitting layer is resonated, the color purity can be increased due to the emitted lights intensifying each other and the light extracting efficiency can be increased.

The condition of the resonance is usually expressed by Equation 1 shown below. Here, the sign L indicates the optical path between the reflection planes, the sign $\lambda$ indicates the resonance wavelength, and the sign $\phi$ indicates the sum of phase shifts occurring when light is reflected off the two reflection planes.

$$2L/\lambda + \phi/2\pi = m \text{ (the sign } m \text{ indicates a positive integer)} \quad \text{Equation (1)}$$

However, the above-described resonance does not necessarily occur through two reflection planes. Namely, the above-described resonance occurs similarly even when three or more reflection planes are provided. When three or more reflection planes are provided, the relationship shown by Equation 1 should be satisfied between adjacent reflection planes.

However, in the case where a light-emitting device having the above-described resonator configuration is used, the color misregistration occurs in accordance with an angle in which the light emission is visually identified (view angle). Equation (1) holds when the light emission is observed from the front of the light-emitting device (normal direction). However, when the view angle is considered, the resonance condition is expressed by Equation (2). Here, the sign $\theta$ indicates an angle in which the light emission is visually recognized (view angle). Namely, since the value of cos $\theta$ is decreased as the view angle is increased, the resonance wavelength $\lambda$ is decreased. That is to say, the color misregistration occurs on the shortwave-length side.

$$2L \cos \theta/\lambda + \phi/2\pi = m \text{ (the sign } m \text{ indicates a positive integer)} \quad \text{Equation (2)}$$

Figure 2:
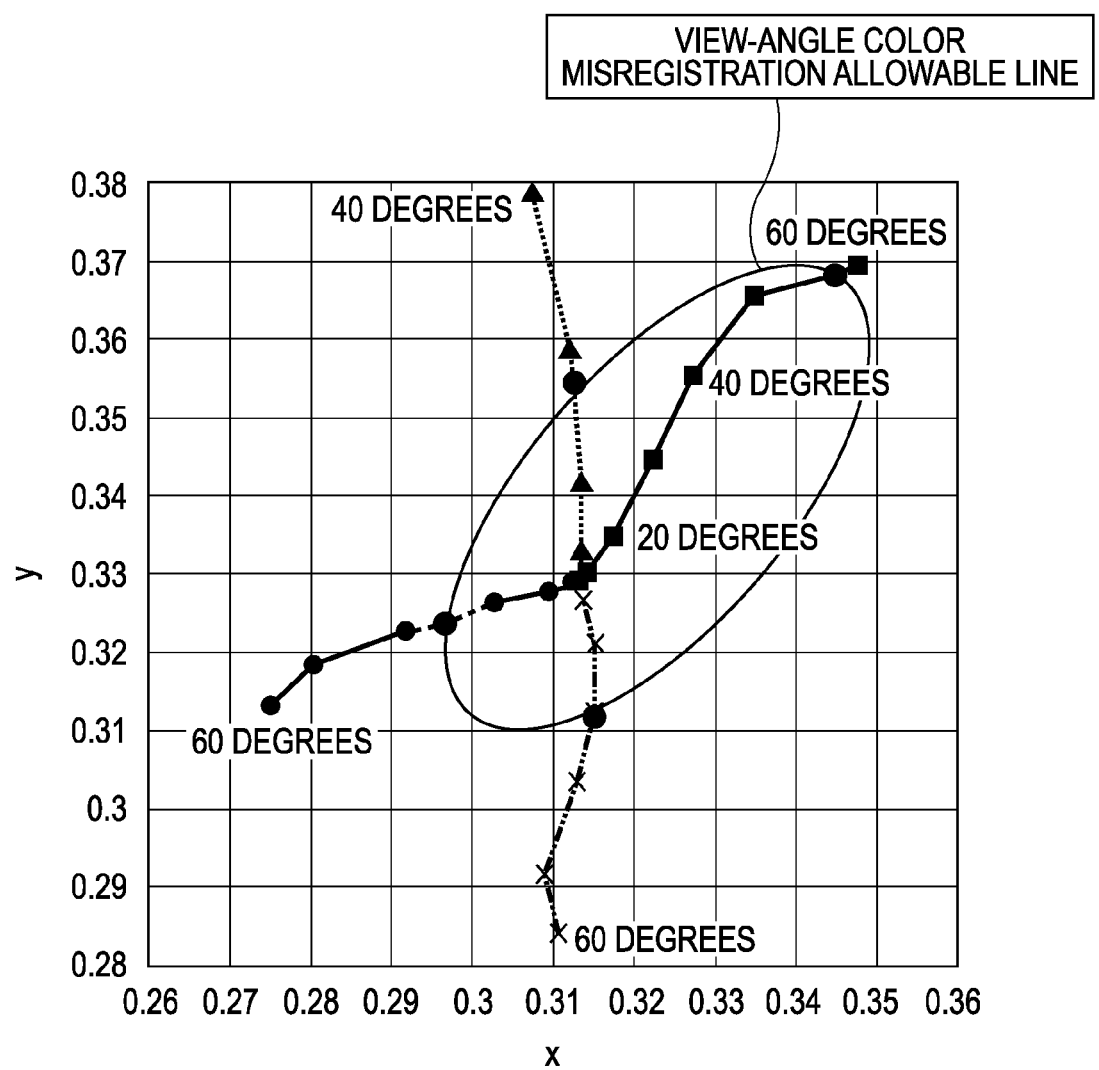
FIG. 2 is a chromaticity diagram showing the results of the view-angle color misregistration sensory evaluation.

When the above-described color misregistration occurs due to the view angle, the color misregistration also occurs for a white color expressed by the mixture of colors of light: red, green, blue, and so forth. When verifying the color misregistration at a level acceptable for the white color without an uncomfortable feeling through sensory evaluations, the verification shows that color misregistration occurring in the yellow direction is the most tolerable color misregistration, as shown in FIG. 2. Here, FIG. 2 will be described in detail. When the sensory evaluations are performed by using four types of display panels with different directions in which the color misregistration occurs due to the view angle, a result shown in FIG. 2 is obtained. In that case, the white balance of each of the display panels is adjusted to a color temperature of 6500K, that is, CIExy (0.31, 0.33), and a figure subject is used as an evaluation image. According to the above-described result, it becomes evident that even though the color misregistration occurs on the display panel due to the view angle, the color misregistration is recognized with relative difficulty so long as the color misregistration value falls inside a view-angle color misregistration allowable line shown in FIG. 2. Namely, the largest allowable range is obtained when the direction of the color misregistration is changed from the white direction to the yellow direction. The allowable range is decreased for other colors.

According to an embodiment of the present invention, an optical member is provided on the light-extracting side of the light-emitting-device group, where the optical member makes a correction so that the white color misregistration caused by the resonator configuration provided in the light-emitting device is shifted toward the yellow direction. The above-described optical member absorbs a light falling within a predetermined wavelength range of light emitted in a direction having an angle with respect to the normal direction of the display apparatus. Then, the predetermined wavelength range is set so that the hue of light emitted in the direction having the angle becomes yellow when the light-emitting-device group emits white light.

When the hue of the emitted light becomes yellow, the value of displayed color is shifted in the direction of the major axis of an oval figure which is the color-misregistration allowable line indicated by the sensory evaluation result shown in FIG. 2. In an actual display apparatus, the hue of the emitted light can be measured through a spectrophotometer.

Since the above-described optical member is provided in a display apparatus according to an embodiment of the present invention, conditions may not be set in consideration of the color misregistration for the resonator configuration. Further, it becomes possible to appropriately set the resonance wavelength based on various types of conditions including the color purity or the like. Still further, it becomes possible to provide a display apparatus having a wide-color reproducing range and fine view angle properties.

Hereinafter, a display apparatus according to an embodiment of the present invention will be described in detail with reference to the attached drawings.

FIG. 1 is a schematic sectional view of a display apparatus according to an embodiment of the present invention. According to the above-described display apparatus, an optical member 12 according to an embodiment of the present invention is laminated on the light-extracting side of a light-emitting panel (light-emitting-device group) 11.

Figure 3:
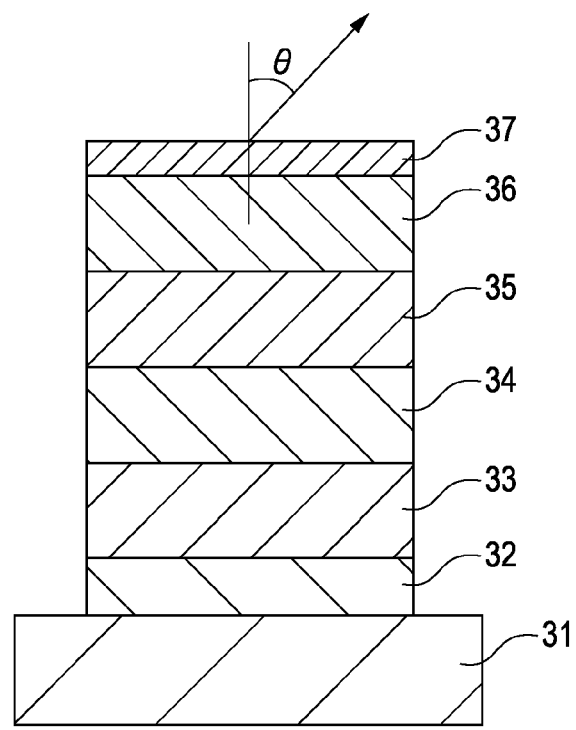
FIG. 3 is a schematic sectional view of an organic light emitting device according to an embodiment of the present invention.

FIG. 3 is an enlarged schematic sectional view of an exemplary light emitting device included in the light-emitting panel (light-emitting-device group) 11. According to the configuration of the above-described device, an anode 32 as the first electrode, a hole transport layer 33, a light emitting layer 34, an electron transport layer 35, an electron injection layer 36, and a cathode 37 as the second electrode which is translucent are orderly provided on a substrate 31. When a current is passed through the above-described device, a hole injected from the anode 32 and an electron injected from the cathode 37 are recombined with each other in the light-emitting layer 34, so that light is generated.

The anode 32, which is the first electrode, is a reflection layer made of metals and the interface between the anode 32 and the hole transport layer 33 functions as the first reflection plane of the resonator configuration. Further, the cathode 37, which is the second electrode, is a semitransparent layer having a metal thin film having a thickness of approximately several nm to 30 nm. The interface between the cathode 37 and the electron injection layer 36 functions as the second reflection plane of the resonator configuration. Then, the optical path between the above-described first and second reflection planes is determined so that lights emitted from the light-emitting layer 34 resonate and intensify each other. Without being limited to the above-described configuration, each of the first and second reflection planes may have various configurations. For example, the first electrode may be provided as a transparent electrode, a reflection layer may be provided between the first electrode and the substrate 31, and the first reflection plane may be provided or located on the interface between the first electrode and the reflection layer. Further, when the second electrode is a transparent electrode and a gas layer with a small refractive index, such as air, is provided or located on the light-extracting side of the second electrode, the interface between the second electrode and the gas layer may be determined to be the second reflection plane.

The light-emitting layer 34 may include an organic compound and/or an inorganic compound. According to the above-described embodiment shown in FIG. 3, the light-emitting layer 34 exemplarily includes the organic compound. When the light-emitting layer 34 includes the organic compound, carrier injection-and-transport layers including the hole transport layer 33, the electron transport layer 35, the electron injection layer 36, and so forth may be provided, so as to increase the carrier injection-and-transport property. Only part of the above-described carrier injection-and-transport layers may be provided. The organic compound included in the light-emitting layer and/or the carrier injection-and-transport layers may include low molecules and/or high molecules without any limitations. Known materials may be used as appropriate.

According to the above-described embodiment, the anode 32 is exemplarily provided or located on the substrate 31. However, the cathode 37, the light-emitting layer 34, and the anode 32 may be provided or located on the substrate 31 in that order. Namely, the electrode selection and the order in which the above-described components are laminated may be determined without any limitations. Further, the above-described embodiment discloses a top-emission type display apparatus in which emitted light is extracted from an electrode provided or located opposite to the substrate 31. However, the present invention can be used for a bottom-emission type display apparatus in which emitted light is extracted from an electrode provided or located on the substrate side. Further, the light-emitting panel included in a display apparatus according to an embodiment of the present invention may be driven according to any driving method. Namely, an active-matrix type display apparatus in which the light emission is controlled through a driving circuit such as a switching element or the like provided in each of the light-emitting devices may be used. Otherwise, a passive-matrix type display apparatus may be used so that light emitted from the light-emitting-device group is controlled by providing the light-emitting device at each of the intersections of stripe electrodes and selecting the light-emitting devices in sequence.

Figure 4:
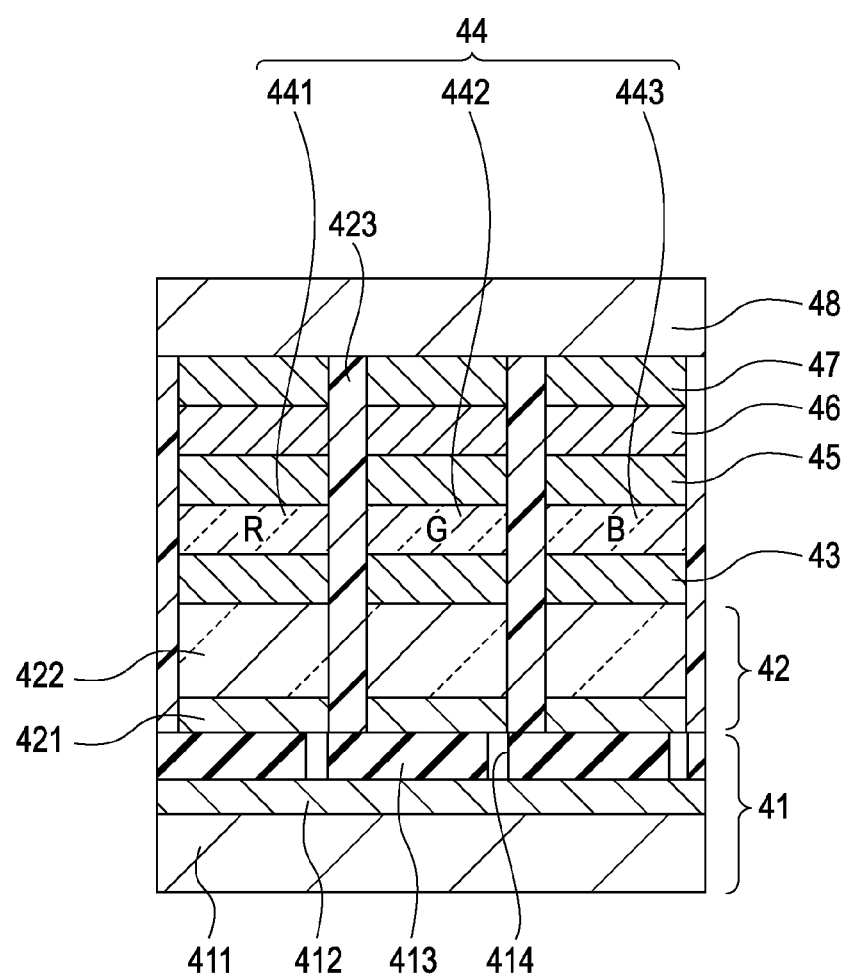
FIG. 4 is a schematic sectional view of a top-emission type active matrix organic light emitting panel according to an embodiment of the present invention.

FIG. 4 is a schematic sectional view of an exemplary top-emission type and active-matrix type light emitting panel. A substrate 41 includes a support member 411, a thin-film-transistor (TFT) driving circuit 412, and a planarization layer 413.

Although the composition of the support member 411 used in an embodiment of the present invention is not limited, the support member 411 includes a metal, ceramic, glass, quartz, and so forth. Further, a flexible display apparatus including the TFT driving circuit 412 placed on a flexible sheet including a plastic sheet or the like may be provided.

The anode 42 including a reflective metal 421 and a transparent conductive layer 422 is provided or located on the substrate 41. The anode 42 and the TFT driving circuit 412 are electrically connected through a contact hole 414. The reflective metal 421 may have a reflectivity of at least 50%, but is typically at least 80% on the interface between the reflective metal 421 and the transparent conductive layer 422. Although the material of the reflective metal 421 is not limited, a metal including, for example, silver, aluminum, and chromium, and/or an alloy of the above-described metals is used.

The transparent conductive layer 422 may include an oxide electroconductive film. More specifically, the transparent conductive layer 422 may be provided as a sheet of film made of a compound including an indium oxide and a tin oxide, which is an indium tin oxide (ITO) and/or a sheet of film made of a compound including the indium oxide and a zinc oxide, which is an indium zinc oxide (IZO). Here, the term "transparent" used in the above-described embodiment indicates that the transparent conductive layer 422 has a transmittance of 80% to 100% for a visible light. Further, the transparent conductive layer 422 may have an extinction coefficient k of 0.05 or less, but is typically 0.01 or less, so as to decrease an attenuation caused by multiple reflection. The thickness of the transparent conductive layer 422 according to an embodiment of the present invention is determined depending on its refractive index and/or the color of light emitted from the display apparatus. However, the thickness of the transparent conductive layer 422 may be determined so that the thickness of the hole transport layer 43 falls within a range of from 10 to 200 nm, but is typically a range of from 10 to 100 nm, since low-voltage driving is advantageous for decreasing power consumption.

The anode 42 is provided for each pixel through patterning and separated by a device separation layer 423. The device separation layer 423 includes a member absorbing external light, such as a resin including carbon black, so as to decrease the external light reflection occurring between pixels and achieve a display apparatus with a higher contrast.

In an area surrounded by the device separation layer 423, the hole transport layer 43, the light-emitting layer 44, the electron transport layer 45, the electron injection layer 46, and the cathode 47 are provided on the anode 42 in that order. However, the above-described layers may be formed astride the light-emitting devices, that is, the device separation layers 423. The light-emitting layers include materials varying among the colors of emitted lights so that a light-emitting layer 441 emitting a red light, a light-emitting layer 442 emitting a green light, and a light-emitting layer 443 emitting a blue light are provided respectively. In addition to the above-described three light-emitting devices, a white-light emitting device having a light-emitting layer emitting a light of a different color, that is, the white color, may be provided.

A protection layer 48 is provided or located on the cathode 47 astride the light-emitting devices, so as to cover the entire faces of the light-emitting devices. The protection layer 48 is provided to protect the electrodes, the light-emitting layers, and so forth from oxygen, water, and so forth. The material of the protection layer 48 may be a sheet of metal nitride film including a silicon nitride, a silicon oxynitride, and so forth, a sheet of metal oxide film including a tantalum oxide, a sheet of diamond thin film, and a sheet of high-molecule film including a fluorine resin, poly-paraxylene, polyethylene, a silicon resin, a polystyrene resin, and so forth. Further, the material of the protection layer 48 may be a photo-curing resin or the like. Further, the protection layer 48 can cover glass, a gas impermeable film, a metal, and so forth, and package the devices themselves by using an appropriate sealing resin. Further, a hygroscopic material may be included in the protection layer 48 so as to increase the hygroscopicity. In the case where the protection layer 48 is not provided, the light-emitting panel 11 is capped with glass or the like and the hygroscopic material is provided or located inside the cap so as to keep the organic compound layers from contact with oxygen, water, and so forth.

Thus, the device configuration of the light-emitting panel 11 has been explained. However, the materials, the configuration, and so forth of the light-emitting panel 11 are not limited to those described in the above-described embodiment. Although the above-described light-emitting panel 11 includes the light-emitting devices of three colors including red (R), green (G), and blue (B), a light-emitting panel including a color filter laminated on a white-light emitting device may be used.

An exemplary view angle property (from front and normal direction (0 degrees) to sixty degrees) of the above-described light-emitting panel 11 including the light-emitting devices of the three colors R, G, and B is shown in Table 1.

TABLE 1

| VIEW ANGLE | R | | | G | | | B | | |
|---|---|---|---|---|---|---|---|---|---|
| | CIEx | CIEx | RELATIVE LUMINANCE | CIEx | CIEx | RELATIVE LUMINANCE | CIEx | CIEx | RELATIVE LUMINANCE |
| 0° | 0.655 | 0.338 | 1.000 | 0.244 | 0.679 | 1.000 | 0.141 | 0.090 | 1.000 |
| 10° | 0.653 | 0.340 | 0.998 | 0.239 | 0.680 | 0.957 | 0.142 | 0.088 | 0.944 |
| 20° | 0.649 | 0.345 | 1.036 | 0.227 | 0.680 | 0.895 | 0.144 | 0.081 | 0.846 |
| 30° | 0.642 | 0.353 | 1.072 | 0.212 | 0.675 | 0.795 | 0.147 | 0.074 | 0.722 |
| 40° | 0.635 | 0.360 | 0.986 | 0.200 | 0.659 | 0.645 | 0.151 | 0.069 | 0.583 |
| 50° | 0.631 | 0.364 | 0.838 | 0.198 | 0.635 | 0.500 | 0.154 | 0.071 | 0.485 |
| 60° | 0.634 | 0.361 | 0.672 | 0.208 | 0.615 | 0.376 | 0.158 | 0.081 | 0.420 |

Figure 5:
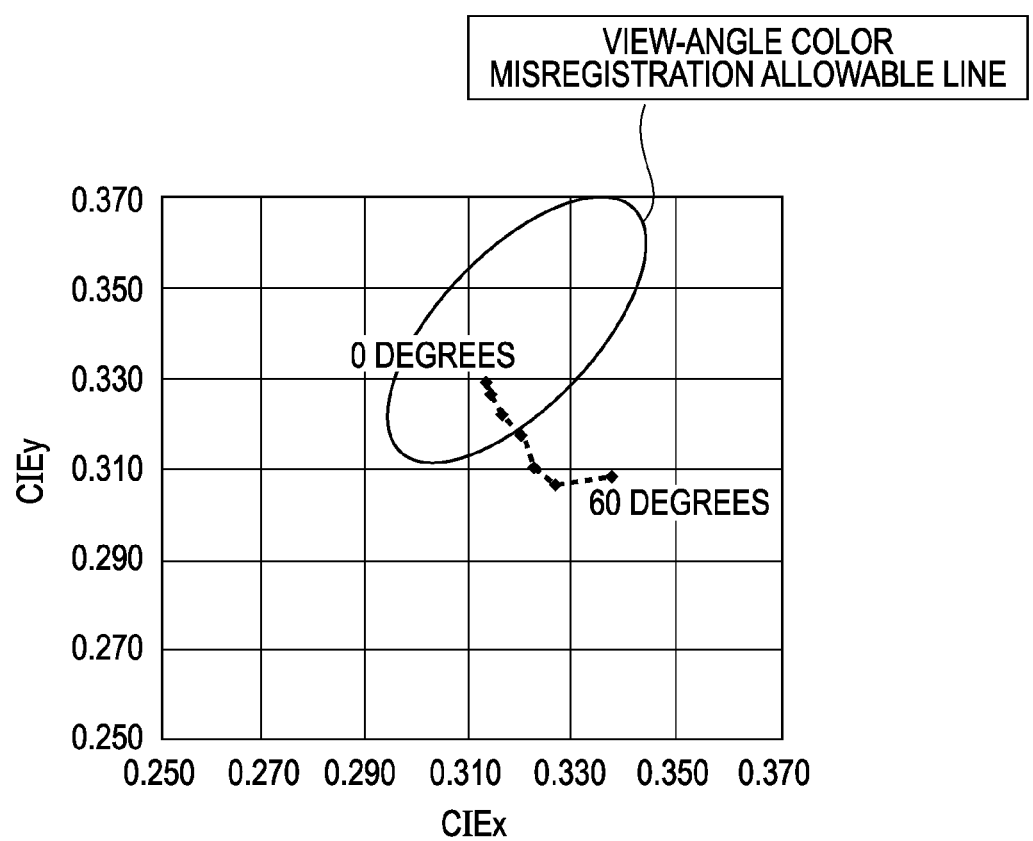
FIG. 5 is a chromaticity coordinate diagram showing the view angle property for white (CIExy chromaticity coordinates) of a display device according to an embodiment of the present invention.
Figure 6:
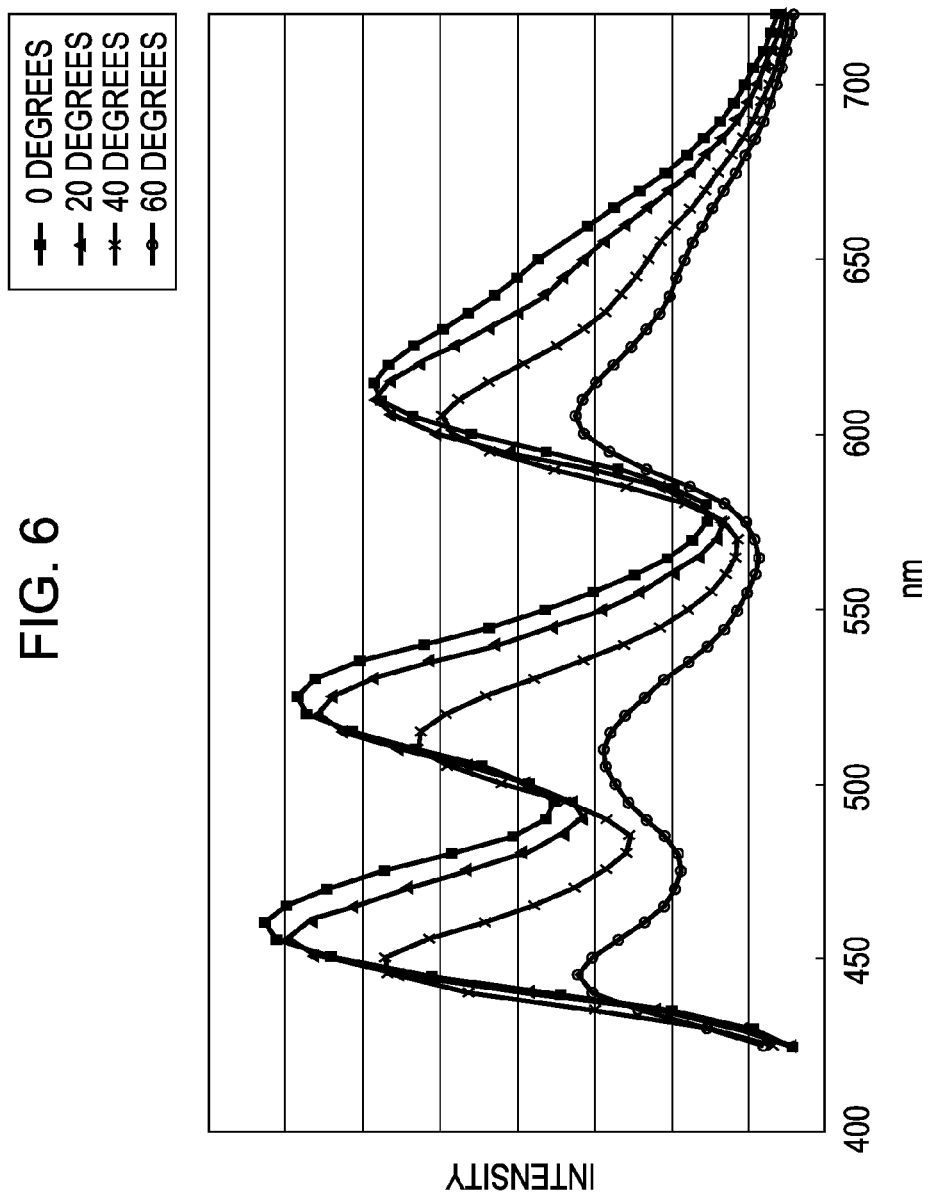
FIG. 6 is a diagram showing the view angle property for white (spectroscopic spectrum) of a display device according to an embodiment of the present invention.

When the light-emitting devices emitting the lights of R, G, and B have the above-described view angle properties and the white balance obtained in the front direction is adjusted to a color temperature of 6500K (CIExy (0.31, 033)), the white has view-angle properties shown in FIGS. 5 and 6. When the white has the view angle property shown in FIG. 5, the light-emitting devices take on a magenta tinge, which deteriorates the display quality.

Further, even though the film thickness of each of the devices may be designed in consideration of changes in the brightness and the chromaticity of each of the colors of R, G, and B so as to reduce the misregistration of a neutral color (white), an allowable margin of film-thickness variations is decreased.

According to an embodiment of the present invention, therefore, color misregistration occurring due to the white-color view angle is corrected by using the optical member 12. As a matter of course, the optical member 12 typically reduces the white-color misregistration of the light-emitting panel 11. However, variations in the view-angle properties of the light-emitting panels 11 also occur due to variations occurring in the manufacturing process. Therefore, it has been difficult to reduce the color misregistration caused by the view angle through the use of the optical member 12.

As described above, the result of the verification of the color misregistration caused by the view angle, the verification shows that color misregistration toward the yellow direction is highly tolerable for an observer. In the above-described embodiment, therefore, the color misregistration caused by the white-color view angle is corrected toward the yellow direction through the optical member 12.

Figure 7:
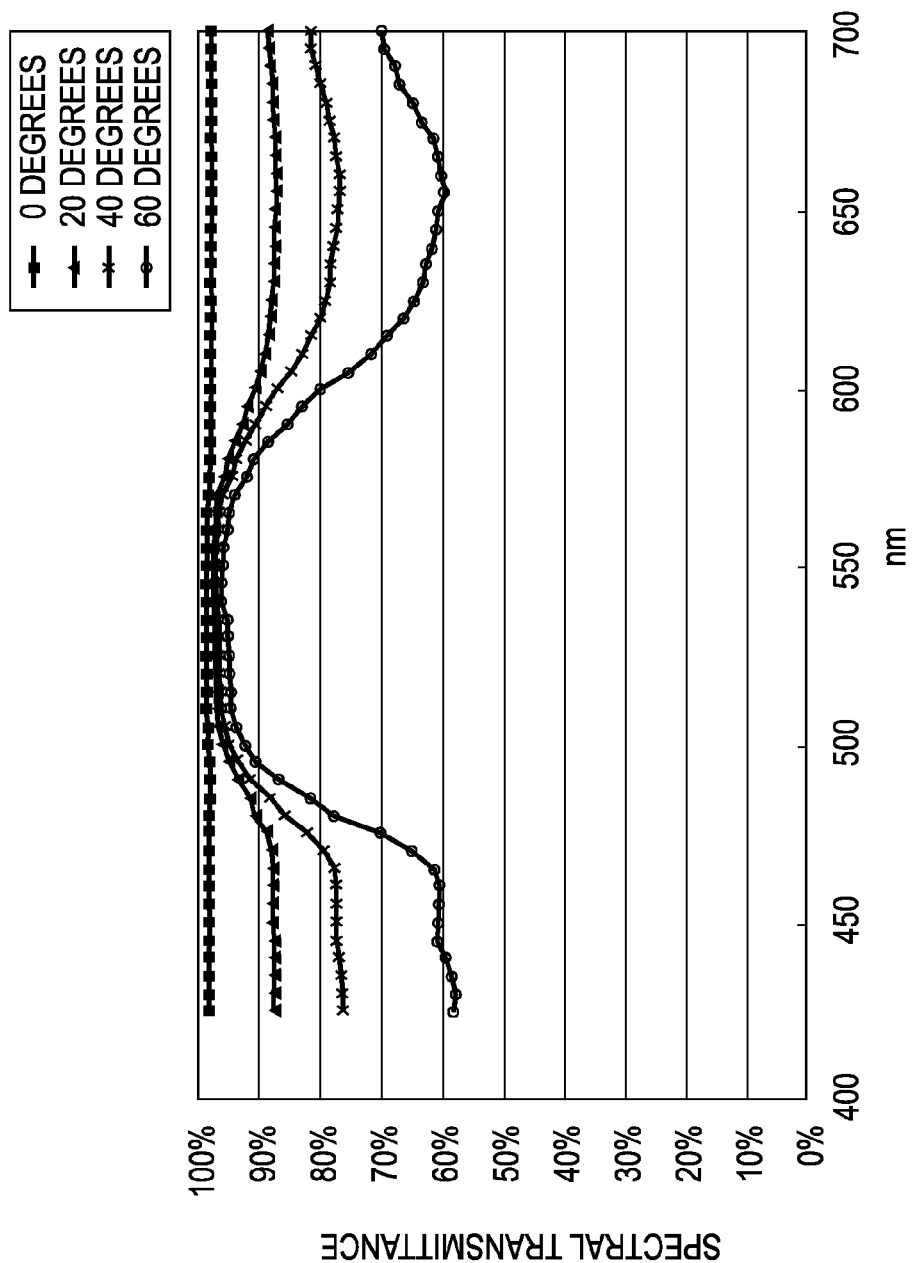
FIG. 7 is a chromaticity coordinate diagram showing the view angle property of an optical member according to an embodiment of the present invention.
Figure 8:
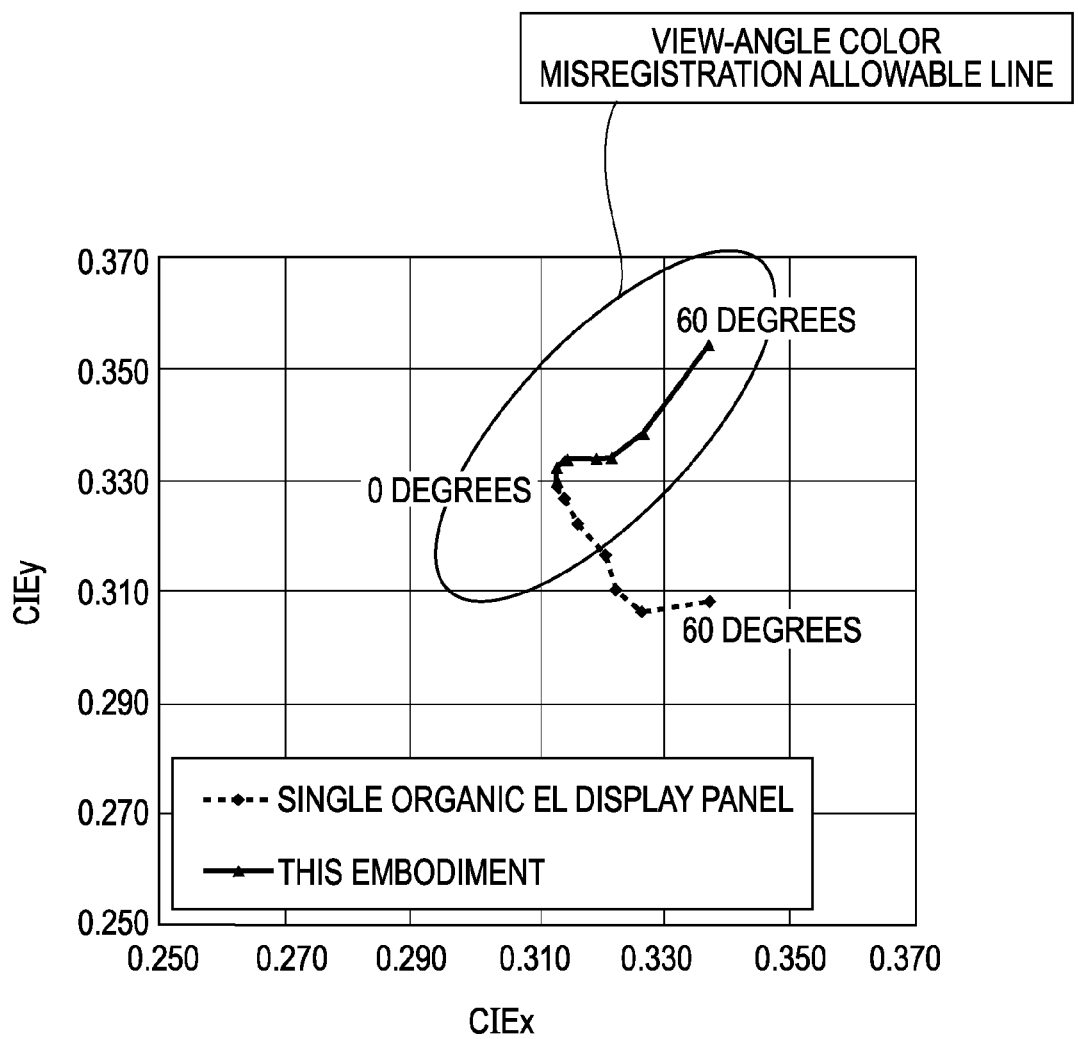
FIG. 8 is a chromaticity coordinate diagram showing the view angle property of a display apparatus according to an embodiment of the present invention.

The spectral transmission spectrum of the optical member 12 according to the above-described embodiment has, for example, a view-angle property shown in FIG. 7. When the above-described optical member 12 is provided or located on the light-extracting side of the light-emitting panel 11 having the view-angle property shown in FIG. 6, a view-angle property indicated in FIG. 8 showing the CIExy chromaticity coordinates can be obtained.

The optical member 12 can be selected based on a view-angle property obtained when the optical member 12 is not provided. In the manufacturing process, a several types of the optical members 12 are prepared, and the optical member 12 provided in the display apparatus is selected for use in accordance with the property of the light-emitting panel 11. Consequently, it becomes possible to use an optical member according to an embodiment of the present invention irrespective of the view-angle property of the light-emitting panel 11.

According to the following embodiments of the present invention, the light-emitting panel 11 having the property shown in FIG. 5 is exemplarily manufactured. However, the color misregistration can be corrected irrespective of the property of the light-emitting panel 11, as described above.

Thus, the display apparatuses according to the above-described embodiments have been explained. However, the above-described display apparatuses can be used for various purposes including illumination, the display of an electronic device, the backlight of a display apparatus, and so forth. The display of the electronic device may be the display of each of a television system and a personal computer, the rear display unit of an image pickup apparatus, the display unit of a mobile phone, the display unit of a mobile game machine, and so forth. In addition, the display of the electronic device may be the display unit of a mobile music reproducing device, the display unit of a personal digital assistant (PDA), the display unit of a car navigation system, and so forth.

Figure 21:
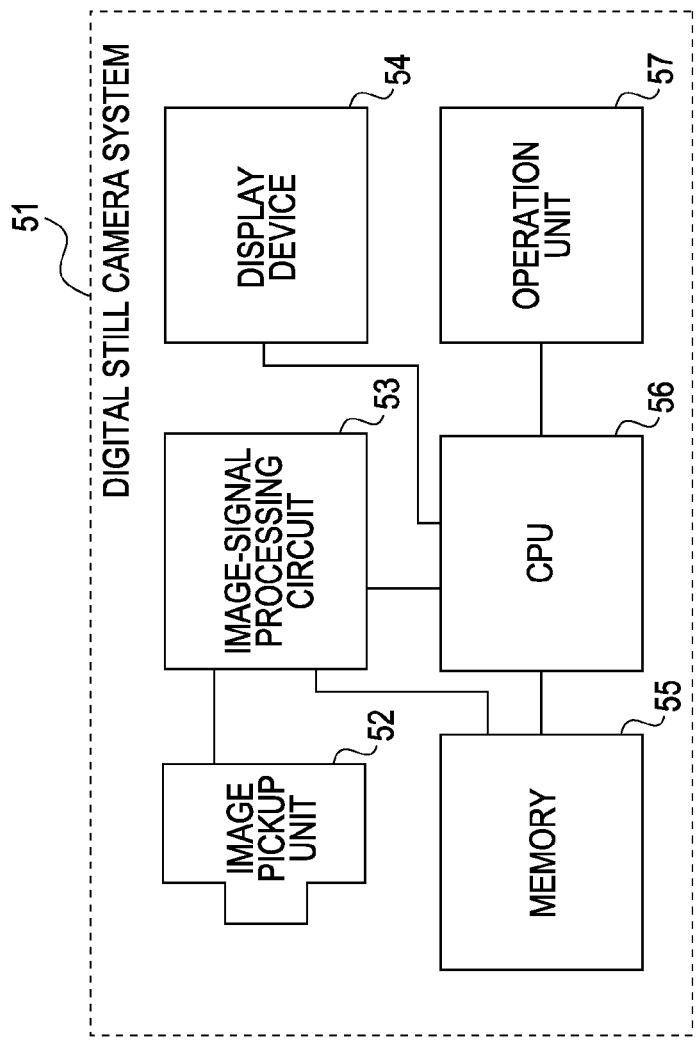
FIG. 21 is a block diagram showing the entire configuration of a digital still camera system according to an embodiment of the present invention.

Of all the above-described devices, the rear display unit of the image pickup apparatus and/or the television system produces the display image of a person with a relatively high frequency. Therefore, the display apparatus according to the above-described embodiments is typically used for the image pickup apparatus and the television system. FIG. 21 is a block diagram showing an exemplary digital still camera system. A digital still camera system 51, an image-pickup unit 52, an image-signal processing circuit 53, a display device 54, a memory 55, a central processing unit (CPU) 56, and an operation unit 57 are shown. Data of an image picked up through the image-pickup unit 52 and/or image data stored in the memory 55 can be subjected to signal processing through the image-signal processing circuit 51 and viewed through the display device 54. The CPU 56 controls the image-pickup unit 52, the memory 55, the image-signal processing circuit 53, and so forth based on data transmitted from the operation unit 55 so as to perform imaging, recording, reproduction, and display according to the circumstances. The image-pickup apparatus includes a still camera and a video camera.

Hereinafter, the optical member which is the characteristic of the present invention will be described in detail with respect to an embodiment of the present invention. However, the configuration, the manufacturing method, and so forth of the optical member are not limited to the above-described embodiment.

Figure 9:
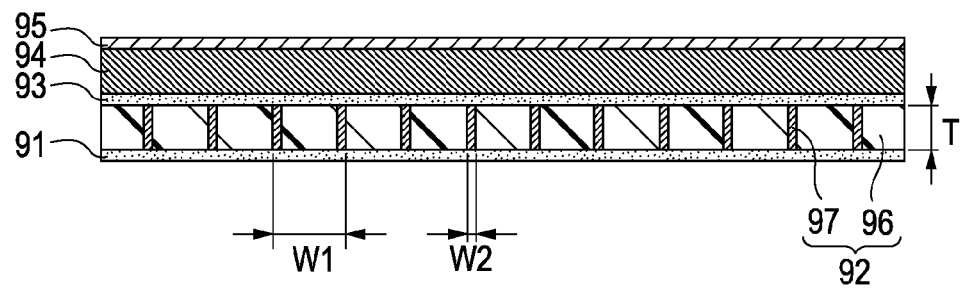
FIG. 9 is a schematic sectional view of an optical member according to a first embodiment of the present invention.
Figure 10:
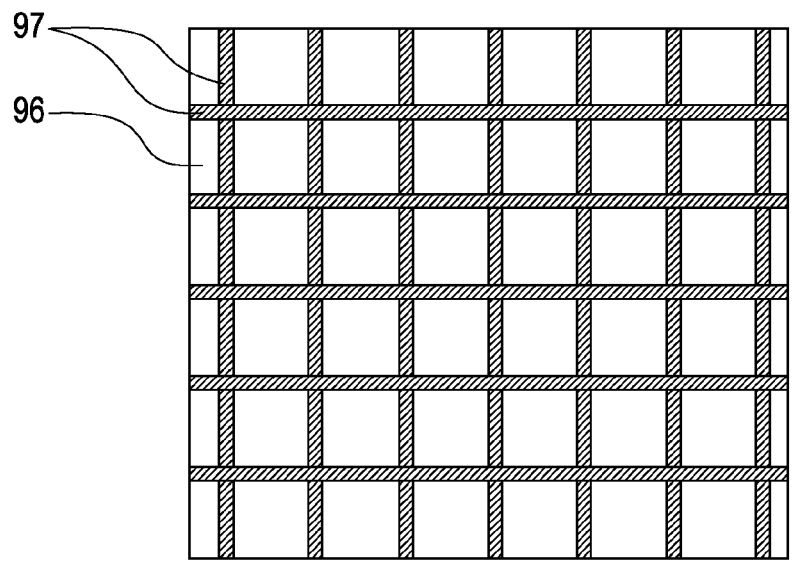
FIG. 10 is a schematic plan view of the optical member according to the first embodiment.

FIG. 9 shows the schematic sectional view of an optical member according to a first embodiment of the present invention and FIG. 10 shows the schematic diagram of the top face of the above-described optical member. The optical member shown in FIG. 9 includes an adhesive layer 91, a sheet of X-direction-control louver film 92, an adhesive layer 93, a sheet of Y-direction-control louver film 94, and a protection layer 95. Here, the term "X direction" denotes a lateral direction along which display information is observed, and the term "Y direction" denotes a vertical direction along which the display apparatus is observed.

The Y-direction-control louver film sheet 94 can be obtained by rotating the X-direction-control louver film sheet 92 through 90 degrees. Namely, the Y-direction-control louver film sheet 94 and the X-direction-control louver film sheet 92 are the same louver film sheet. FIG. 10 shows the top face of the optical member shown in FIG. 9. According to a louver film sheet shown in FIG. 10, a light transmission part 96 allowing incident light to pass through and a color absorbing part 97 absorbing a predetermined wavelength range of the incident light are alternately placed in the face of the optical member. The predetermined wavelength range is set so that the hue of light emitted in a direction having an angle becomes yellow when the light-emitting-device group emits white light.

The light transmission part 96 is typically provided or located on the light extracting side of a plurality of the light-emitting devices and the color absorbing part 97 be provided or located on the light extracting side between the light-emitting devices. When the color absorbing part 97 is provided or located on the light extracting side of the light-emitting device, the color misregistration may slightly occur for emitted light extracted to the front (normal direction). However, it becomes possible to virtually reduce the color misregistration occurring at the front by decreasing the light transmittance toward the front direction through the color absorbing part 97 by increasing the thickness of the louver film sheet and/or decreasing the ratio of the area of the color absorbing part 97 to that of the light transmission part 96.

The light transmission part 96 of the louver film sheet is typically made of a component with light transmittance as high as possible. The material may be a thermosetting resin with high transparency, such as an acrylic resin, a silicon resin, an epoxy resin, etc. For increasing the color purity of light emitted from each of the light-emitting devices, a coloring resin including a component with high light transmittance as a base material and a colorant mixed into the component may be used, where the colorant includes a pigment, a dye, and so forth of the color corresponding to the color of the emitted light.

As the material of the color absorbing part 97, a coloring resin including the above-described component with the high light transmittance as a base material and a colorant mixed into the base material are used based on the color misregistration occurring on the light-emitting panel. The colorant includes a pigment, a dye, and so forth such that the hue of light emitted in a direction having an angle becomes yellow.

According to the above-described embodiment, the acrylic resin is exemplarily used as the component of the light transmission part 96 of the louver film sheet. Further, the color absorbing part 97 exemplarily includes an acrylic color resist material used as the color filter of a liquid crystal display (LCD).

The layer configuration of the louver film sheet and the transmission spectrum of the color absorbing part 97 are adjusted based on the view-angle property of an organic light-emitting panel 11. The organic light-emitting panel 11 according to the above-described embodiment has the view-angle properties shown in FIGS. 5 and 6, as is the case with the panel described in the above-described embodiments. The setting parameters includes the thickness T of the louver film sheet, the pitch $W_1$ between the adjacent color absorbing parts 97, the width $W_2$ of the color absorbing part 97, and the transmission spectrum of the color absorbing part 97.

Figure 11:
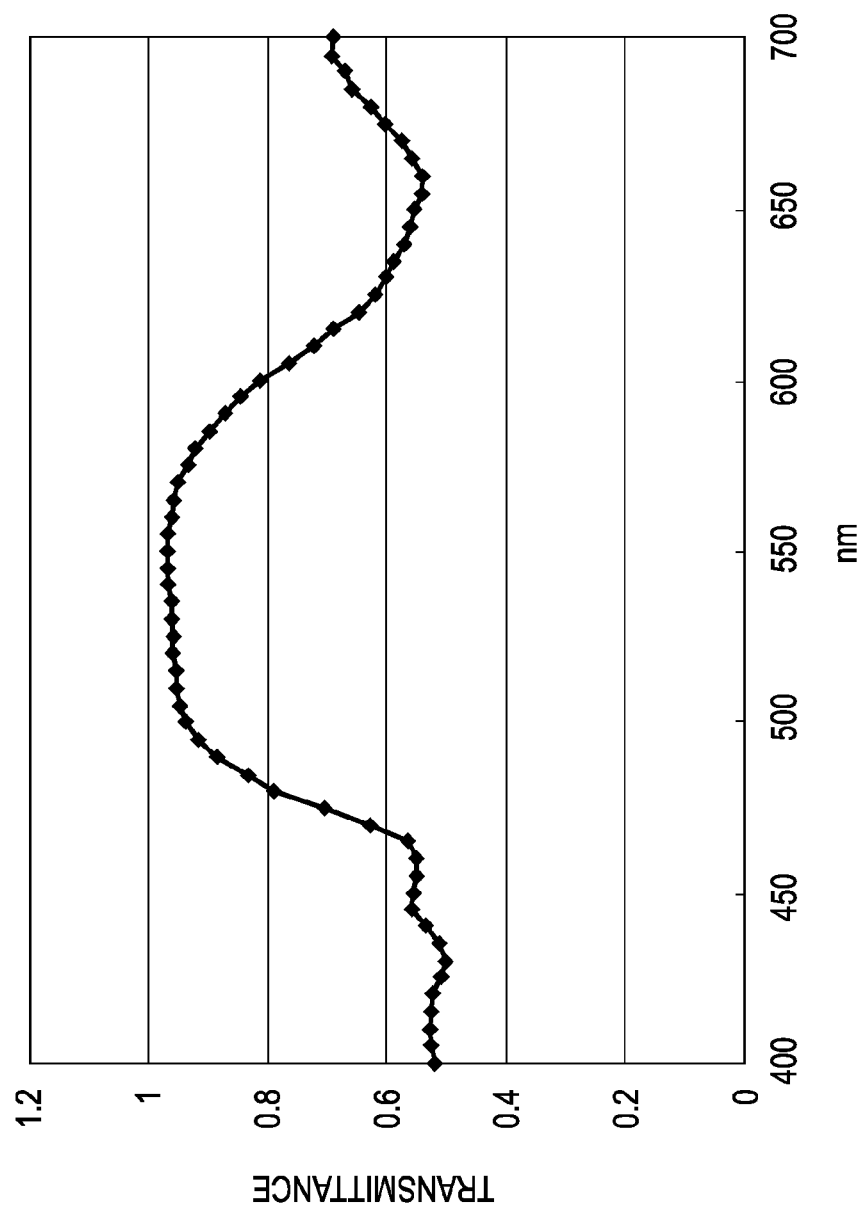
FIG. 11 is a diagram showing the transmission spectrum of a color resist material according to the first embodiment.

Since the organic light-emitting panel 11 has a view-angle property of shifting a color in the magenta direction, the color absorbing part typically has a property so that the transmittance is increased over the range of from yellow to green. In the above-described embodiment, therefore, a color resist material (with a film thickness of 2 μm) having a transmission spectrum shown in FIG. 11 is used. Further, the value of the pitch W1 between the adjacent color absorbing parts 97 is determined to be 1000 μm, the value of the width $W_2$ of the color absorbing part 97 is determined to be 2 μm, and the value of the film thickness T is determined to be 300 μm. The view-angle property of the transmission spectrum of the louver film sheet adjusted in the above-described manner is shown in FIG. 7 indicated in the above-described embodiment.

The method of manufacturing the louver film sheet will be described. First, a transparent acrylic resin is applied on a support member including a glass substrate or the like as the component of the light transmission part 96 and subjected to thermosetting so that the value of the film thickness ($W_1$-$W_2$) becomes 998 μm. Further, an acrylic color resist material having the transmission spectrum shown in FIG. 11 is applied on the above-described transparent acrylic resin as the component of the color absorbing part 97 and subjected to thermosetting so that the value of the film thickness ($W_2$) becomes 2 μm. Still further, the transparent acrylic resin and the color resist material are alternately laminated on the acrylic color resist material in a like manner. Then, the above-described process is repeatedly performed until the cross-sectional area of the laminated body becomes equivalent to a desired sheet area. Then, the support member (glass substrate) may be peeled off. Further, the above-described laminated body is cut so that the value of the film thickness T becomes 300 μm. In the above-described manner, the louver film sheet is generated and used as the X-direction control louver film sheet 92 and the Y-direction control louver film sheet 94.

The optical member 12 shown in FIG. 9 is formed by bonding the above-described X-direction control louver film sheet 92 and Y-direction control louver film sheet 94 together. The optical member 12 obtained in the above-described manner is disposed on the light-emitting panel 11. When the optical member 12 is disposed, the color absorbing parts 97 are aligned in the X and Y directions so that the color absorbing parts 97 are positioned between the light-emitting devices. Consequently, the view-angle property shown in FIG. 8 can be corrected.

In the above-described embodiment, the louver film sheets adjusting the color misregistration occurring in two directions including the X and Y directions are exemplarily provided. According to an embodiment of the present invention, however, only a louver film sheet adjusting color misregistration occurring in either the X direction or the Y direction may be provided. There is the case where the visual recognition direction is limited depending on an electronic device for use so that an observation is rarely made by changing an angle toward either the X direction or the Y direction. In that case, a louver film sheet configured to adjust color registration occurring in only a direction in which the observation is made by changing the angle may be provided.

Figure 12:
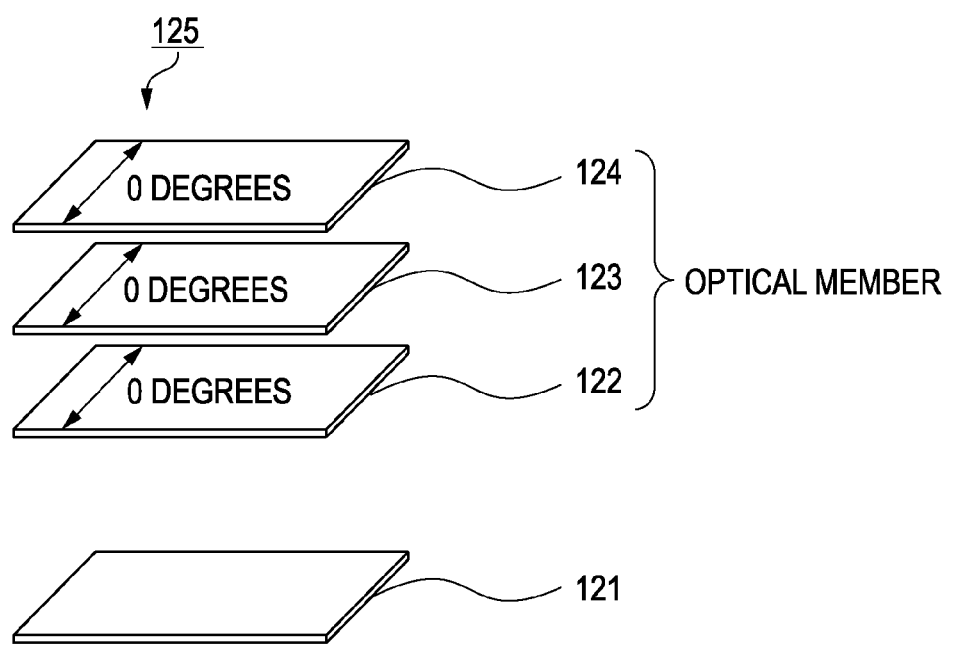
FIG. 12 is a schematic perspective view of a display apparatus according to a second embodiment of the present invention.

FIG. 12 is a schematic diagram showing the configuration of a display apparatus according to a second embodiment of the present invention. According to the second embodiment, the first polarization member 122, a retardation member 123, and the second polarization member 124 are orderly disposed on a light-emitting panel (light-emitting-device group) 121 so that a display apparatus 125 is configured. Namely, the optical member according to the above-described embodiment is a member including the first polarization member, the retardation member, and the second polarization member are orderly laminated on the light extracting side of the light-emitting panel.

According to the optical member of the above-described embodiment, each of the anisotropic refractive index (retardation) and the thickness of the retardation member is set to a desired value, so as to cause the color change when the observation is made from a slanting direction.

The light transmittance of the optical member according to the above-described embodiment is expressed by the light wavelength λ and the function of retardation Δnd. However, the retardation Δnd is changed as the view angle is changed. The optical member according to the above-described embodiment is configured to change the transmittance of light having a predetermined wavelength based on a change in the retardation, the change being caused due to the view angle. Namely, the value of Δn of the retardation member and the value of the thickness d of the retardation member are set so that light is uniformly passed in a wavelength area defined in the visible light area at the front and the transmittance of yellow light becomes higher than that of light of other colors in the visible light area in a slanting direction. Consequently, the hue of light emitted in the slanting direction becomes yellow.

Next, each of members included in the display apparatus according to the above-described embodiment will be described.

<Polarization Members (Linear Polarization Member) 122 and 124>

The polarization member is a filter configured to extract linear polarization vibrated only in a predetermined direction from among lights vibrated in every direction. For example, the polarization member includes a dichroic dye such as iodine absorbed and aligned on a sheet of polyvinyl alcohol film which is uniaxially drawn.

Retardation Member 123

As the retardation member, an optically uniaxial retardation member such as the above-described λ/4 phase member and/or an optically biaxial retardation member such as Wide View film including discotic liquid crystal can be used.

According to the above-described embodiment, the members are arranged in the direction of optical axes indicated by arrows shown in FIG. 12. Namely, the short side direction of the light-emitting panel 121 is determined to be a 0° angle, and the absorbing axis of the first polarization member 122 is provided or located at a 0° angle, the optical axis of the retardation member 123 is provided or located at a 0° angle, and the absorbing axis of the second polarization member 124 is provided or located at a 0° angle.

According to the above-described embodiment, the light-emitting panel 121 is determined to be the light-emitting panel shown in FIG. 4. When viewed from a slanting direction, the above-described light-emitting panel takes on a magenta tinge as indicated by FIG. 5.

Next, a linear polarizer made of polyvinyl alcohol (PVA) is bonded onto the protection layer 48 shown in FIG. 4 as the polarization member 122. Further, a retardation plate made of polycarbonate ($n_o$=1.5908, $n_e$=1.5821, Δn=0.0087, thickness: 28.74 μm) is bonded onto the first polarization member 122, as the retardation member 123. At that time, the equation Δnd=0.25 holds. Further, a linear polarizer made of PVA is bonded onto the retardation member 123, as the second polarization member 124. Thus, the display apparatus 125 is manufactured.

Figure 13:
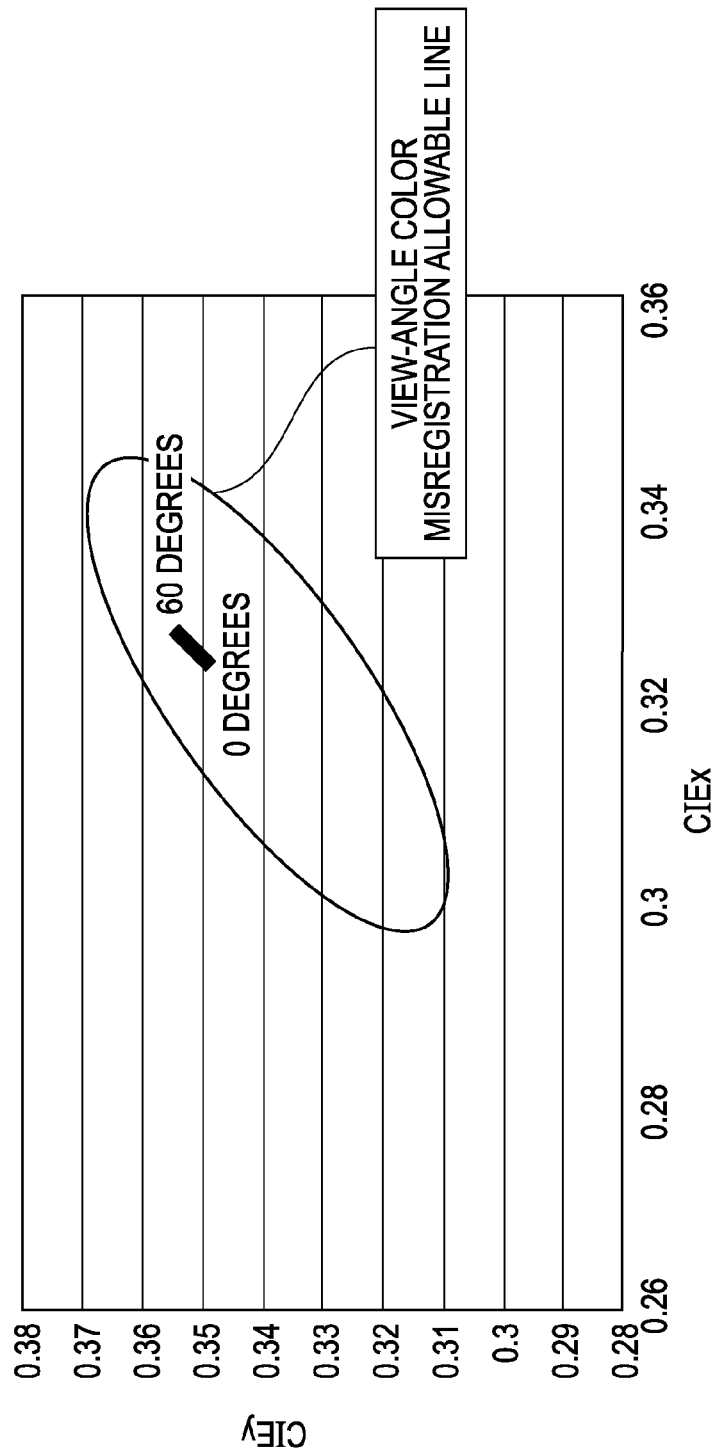
FIG. 13 is a chromaticity coordinate diagram showing the view angle property of the display apparatus according to the second embodiment.

FIG. 13 shows the view-angle property of the display apparatus 125. The above-described view-angle property shows that the white light viewed at the front of the display apparatus turns yellow as the visual-recognition angle is inclined. Further, the result of the sensory evaluation, which is shown in FIG. 2, indicates that the values of the view-angle properties obtained in the range of from 0 degrees to sixty degrees fall within the range of allowable color misregistration. Further, the chromaticity coordinates obtained at each of view angles of 0 degrees and 60 degrees (CIExy chromaticity coordinates) are shown in Table 2. The above-described information reveals that the display apparatus according to the above-described embodiment can obtain view-angle properties appropriate for the human visual property.

A third embodiment of the present invention is equivalent to the second embodiment except that the thickness of the retardation member 123 shown in FIG. 12 is 15.95 μm where the equation Δnd=0.14 holds so that the retardation member 123 becomes a λ/4 retardation member. The chromaticity coordinates obtained at each of view angles of 0 degrees and 60 degrees (CIExy chromaticity coordinates) through the display apparatus according to the above-described embodiment are shown in Table 2. The fact that the values of the above-described chromaticity coordinates are equivalent to those obtained in the second embodiment indicates that the advantage obtained in the third embodiment is equivalent to that obtained in the second embodiment.

Figure 14:
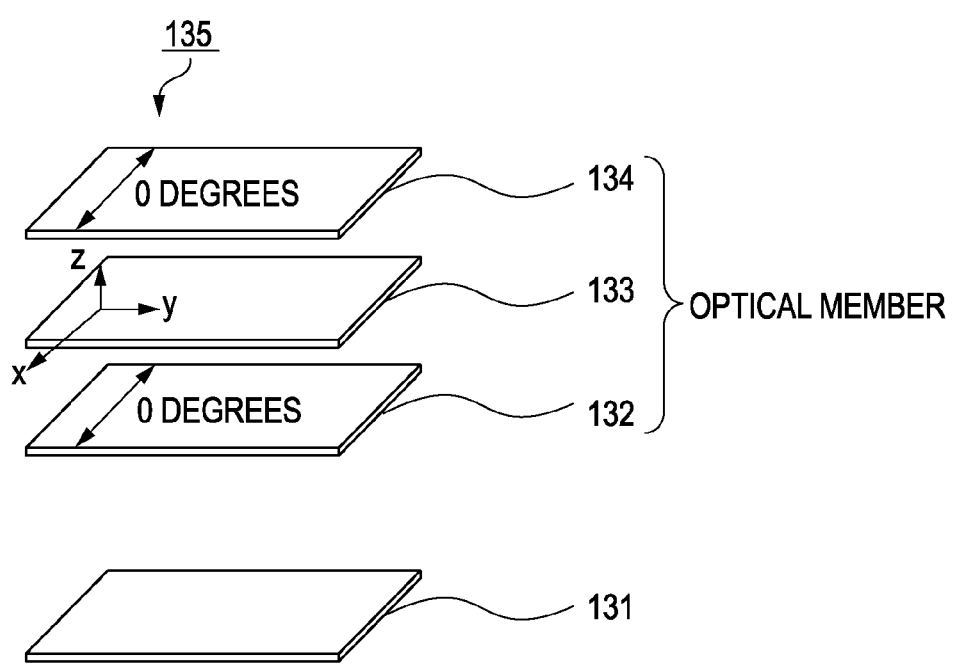
FIG. 14 is a schematic perspective view of a display apparatus according to a fourth embodiment of the present invention.

FIG. 14 is a schematic diagram showing the configuration of a display apparatus according to a fourth embodiment of the present invention. The above-described configuration is the same as that of the second embodiment except that an optically biaxial retardation member 133 is used as the retardation member. However, since the optical axis of the retardation member 133 is biaxial, the short-side direction, the long-side direction, and the film-thickness direction of a light-emitting panel (light-emitting-device group) 131 are determined to be the x axis, the y axis, and the z axis as shown in FIG. 14, and the refractive indices $n_x$, $n_y$, and $n_z$ of the above-described directions are defined along the above-described axes.

Since the polarization axes of the polarization members 134 and 132 that are provided or located above and below the retardation member 133 used in the above-described embodiment are parallel to each other, the retardation member 133 is designed so that the wavelength of blue (440 nm), which is the complementary color of yellow, agrees with retardation.

Namely, the film thickness d is set so that Equation 3 holds.

$$\{(n_z-(n_x+n_y)/2)\}\cdot d=0.44 \text{ (μm)} \qquad \text{Equation (3)}$$

Since the property values of the polycarbonate correspond to the equations $n_x$=1.5867, $n_y$=1.5800, and $n_z$=1.5883, the film thickness d is set so that the equation d=88.9 μm holds. The above-described retardation member 133 is included in the display apparatus 135.

Figure 15:
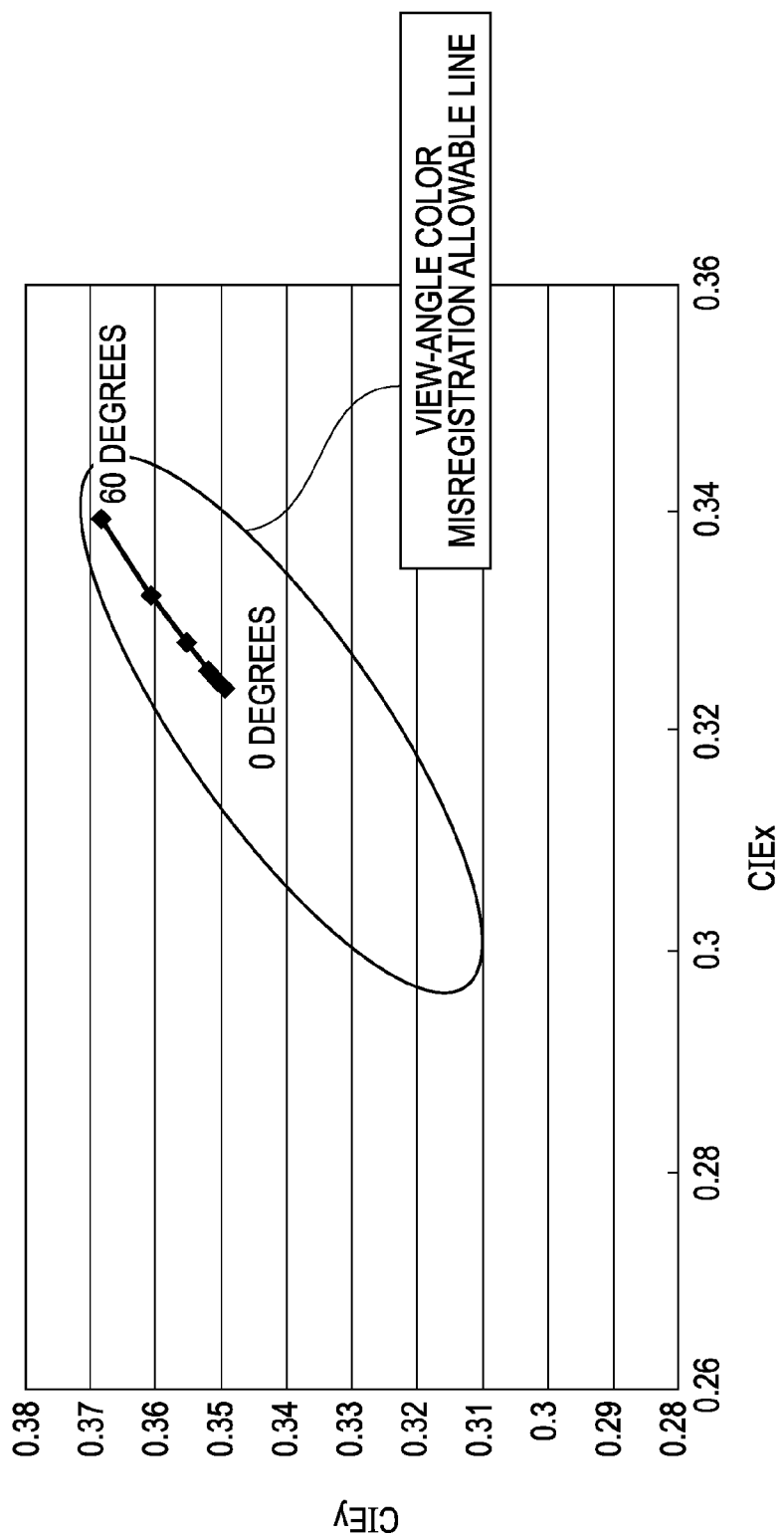
FIG. 15 is a chromaticity coordinate diagram showing the view angle property of the display apparatus according to the fourth embodiment.

FIG. 15 shows the view-angle property of the display apparatus 135. The above-described view-angle property shows that the white light viewed at the front of the display apparatus is changed toward the yellow direction as the visual-recognition angle is inclined. Further, the result of the sensory evaluation shown in FIG. 2 indicates that the values of the view-angle properties obtained in the range of from 0 degrees to sixty degrees fall within the range of allowable color misregistration. Further, the chromaticity coordinates obtained at each of view angles of 0 degrees and 60 degrees (CIExy chromaticity coordinates) are shown in Table 2.

The above-described information reveals that the display apparatus according to the above-described embodiment can obtain view-angle properties appropriate for the human visual property.

Figure 16:
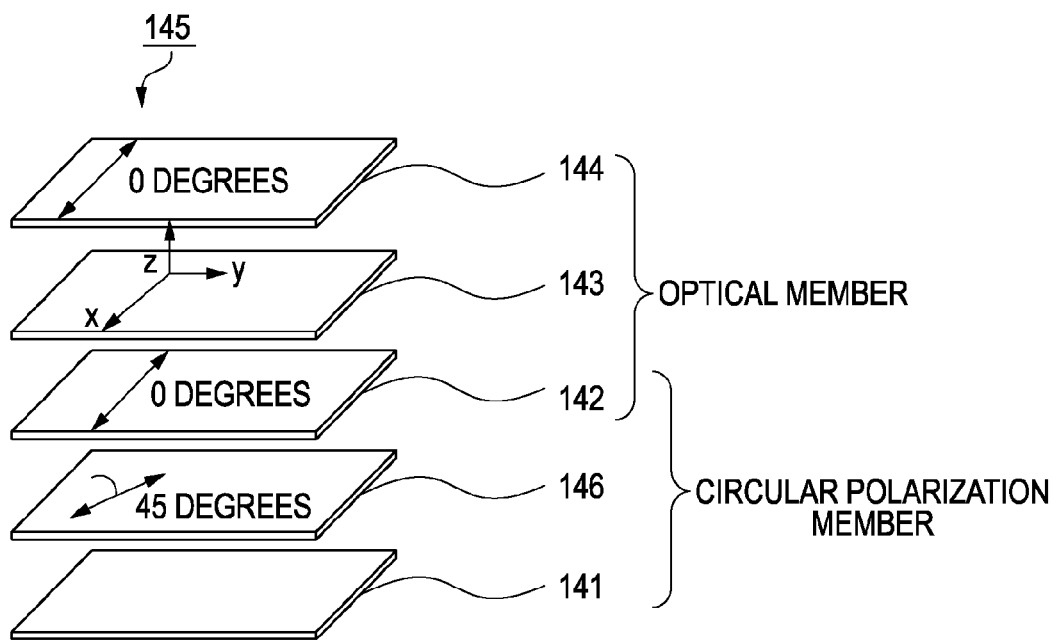
FIG. 16 is a schematic perspective view of a display apparatus according to a fifth embodiment of the present invention.

FIG. 16 is a schematic diagram showing the configuration of a display apparatus according to a fifth embodiment of the present invention. According to the above-described configuration, a λ/4 retardation member is additionally provided, so as to add an external-light-reflection reducing function to the display apparatus according to the fourth embodiment. Namely, λ/4 retardation member 146 is provided or located between the first polarization member 142 and a light-emitting panel (light-emitting-device group) 141 that are included in an optical member according to the above-described embodiment, as shown in FIG. 16.

Generally, the effect of reducing the reflection of light coming from outside (external light) can be obtained by providing a circular polarization member including the λ/4 retardation member and a linear polarization member that are orderly stacked on the light extracting side of a light-emitting panel. According to the above-described embodiment, a polarization member 143 included in an optical member configured to change the hue of light emitted in a direction having an angle into yellow can serve as a member provided to reduce the external light reflection. As a result, changing the hue into yellow through a simplified configuration including a reduced number of members becomes compatible with the effect of reducing the external-light reflection.

Further, the chromaticity coordinates obtained at each of view angles of 0 degrees and 60 degrees (CIExy chromaticity coordinates) are shown in Table 2. The above-described result indicates that the same view-angle property as that obtained in the fourth embodiment can be obtained.

TABLE 2

|  | CHROMATICITY COORDINATES AT VIEW ANGLE 0° | CHROMATICITY COORDINATES AT VIEW ANGLE 60° |
|---|---|---|
| THE SECOND EMBODIMENT | (0.324, 0.350) | (0.326, 0.354) |
| THE THIRD EMBODIMENT | (0.323, 0.350) | (0.326, 0.354) |

TABLE 2-continued

| | CHROMATICITY COORDINATES AT VIEW ANGLE 0° | CHROMATICITY COORDINATES AT VIEW ANGLE 60° |
|---|---|---|
| THE FOURTH EMBODIMENT | (0.324, 0.350) | (0.339, 0.368) |
| THE FIFTH EMBODIMENT | (0.324, 0.350) | (0.339, 0.368) |

Figure 17:
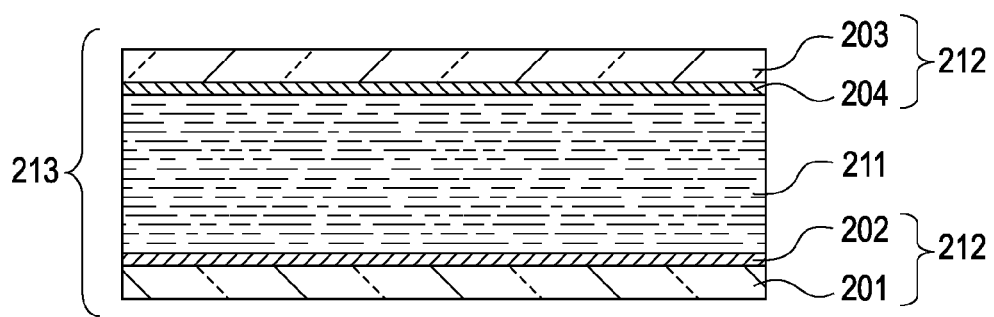
FIG. 17 is a schematic sectional view of an optical member according to a sixth embodiment of the present invention.

FIG. 17 is a schematic diagram indicating the configuration of a display apparatus according to a sixth embodiment of the present invention. According to the above-described display apparatus, an optical member 213 in which a dichromatic dye is vertically oriented with respect to the member intraplanar direction is provided or located on the light extracting side of the light-emitting panel.

Figure 18:
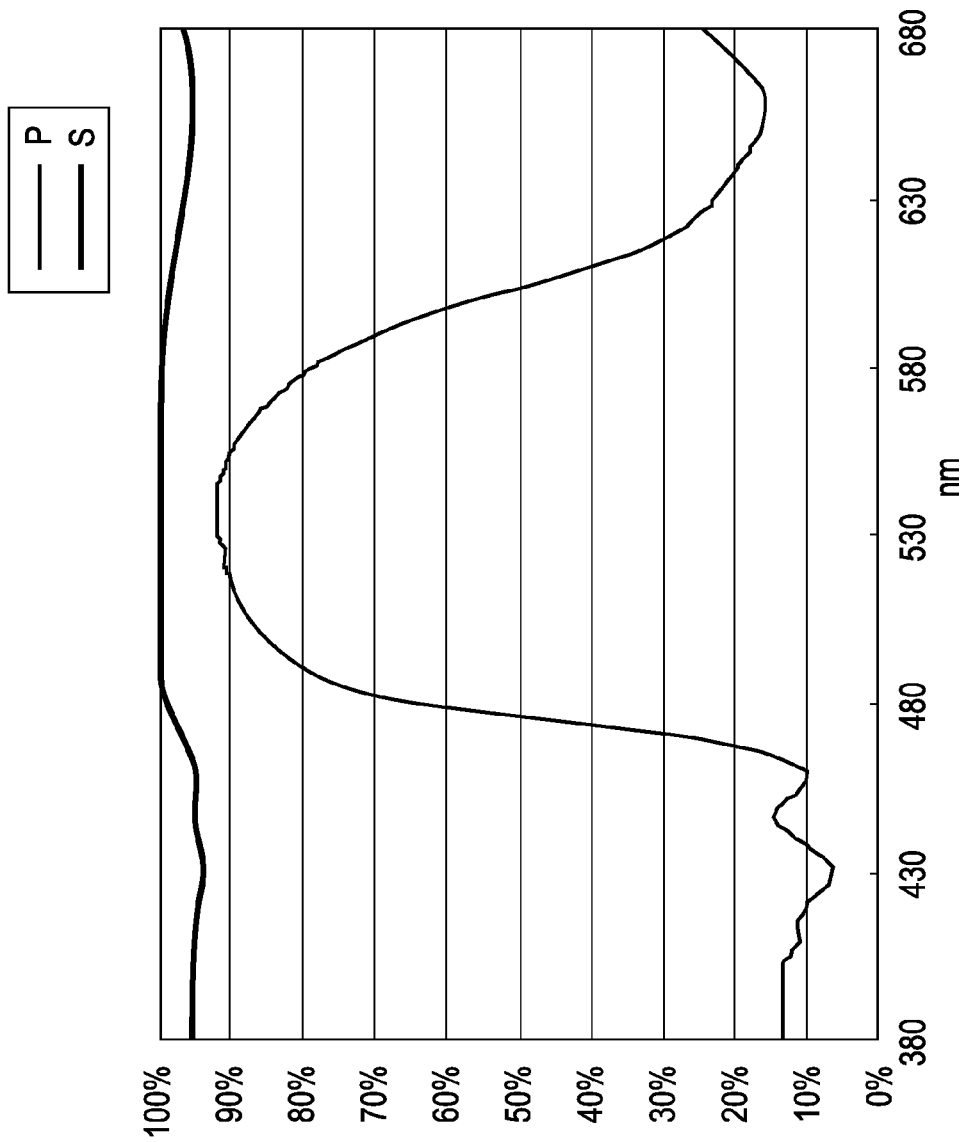
FIG. 18 is a diagram showing the transmission property of a dichromatic dye used in the fourth embodiment.

First, a yellow dichromatic dye and a photopolymerizable monomer are mixed into a nematic liquid crystal so that a liquid crystal composite 211 is generated. Further, the dichromatic dye for use is selected as appropriate based on the view angle property of a single light-emitting panel for lamination. For example, a 0.5% green dichromatic dye having a dichromatic property as shown in FIG. 18 is mixed into a panel on which color misregistration occurs in the magenta direction, as is the case with the above-described light-emitting panel. The dichromatic dye may include an azo dye, an anthraquinone dye, a diazo dye, and so forth.

Next, a vertical alignment material 202 is disposed on a transparent film sheet 201 through application or the like so that a sheet of vertically aligned film 212 is generated. The transparent film sheet 201 may include, for example, a polycarbonate film sheet, a polyethylene terephthalate film sheet, a cellulose triacetate film sheet, and so forth. Further, the vertical alignment material 202 may include lecithin, polyimide, and so forth.

Two sheets of the vertically aligned film 212 are superimposed on each other at a distance of 12 μm and the liquid crystal composite 211 is charged between the two sheets of the film 212 so that the optical member 213 is generated. Next, the optical member 213, which is a sheet of optical compensation film, is irradiated with ultraviolet rays so that the photopolymerizable monomers included in the liquid crystal composite 211 are polymerized. A polymer network is provided in the liquid crystal composite 211 through the above-described polymerization so that the vertically aligned film sheet 212 and the liquid crystal composite 211 are integrated into each other.

Figure 19:
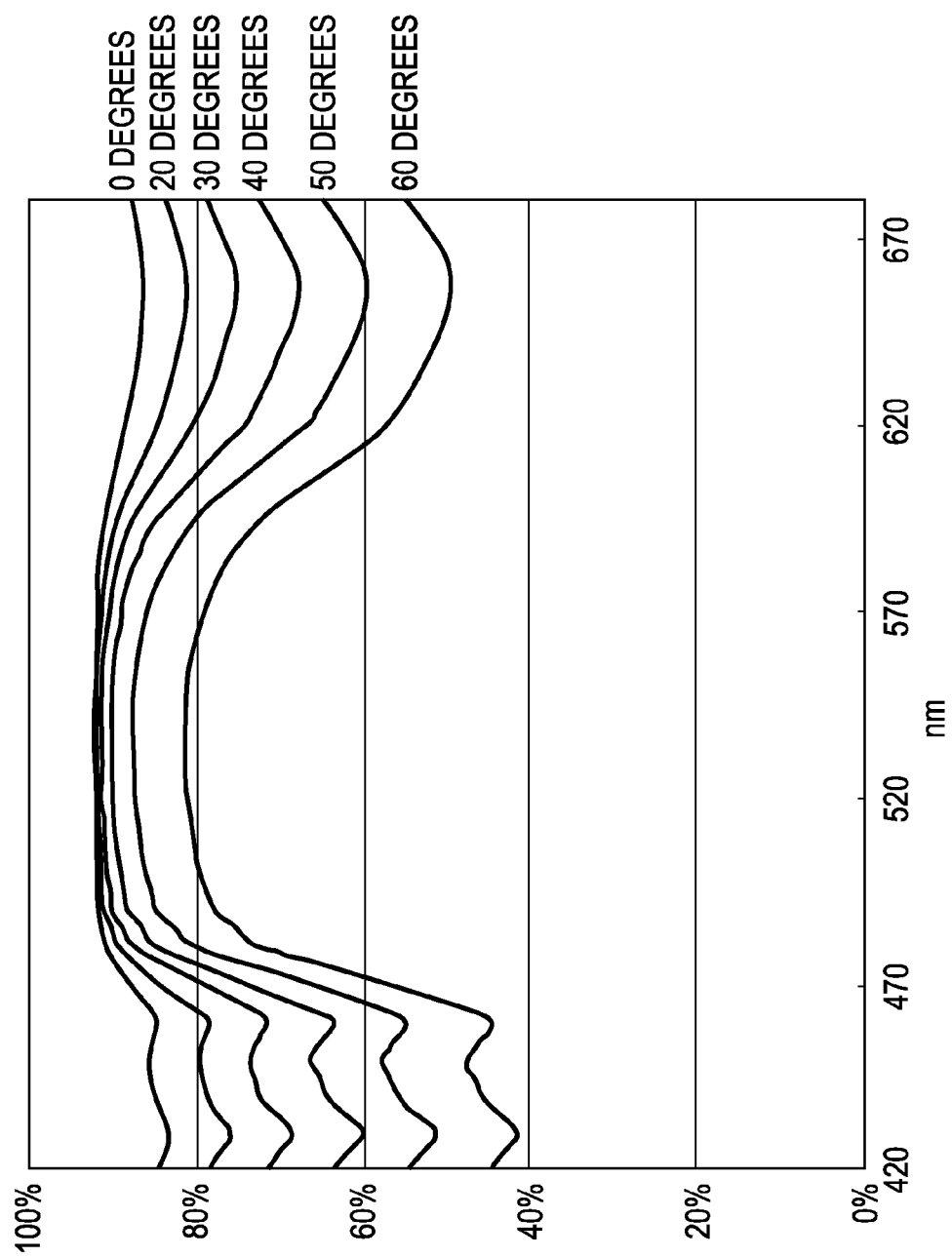
FIG. 19 is a diagram showing the wavelength transmittance property of an optical member used in the fourth embodiment.

The dichromatic dye included in the optical member 213 shown in FIG. 17, which is generated in the above-described manner, is aligned in a vertical direction with respect to the plane surface of the vertically aligned film sheet 212 due to the vertical alignment material 202 applied on the surface of the vertically aligned film sheet 212. Therefore, even though the vertically aligned film sheet 212 is transparent when being viewed from the film vertical direction, the vertically aligned film sheet 212 has a yellowish tint when being viewed from a direction inclined from the film vertical direction. FIG. 19 shows the spectral transmittance property obtained for each angle of the optical member 213 shown in FIG. 17.

Next, the optical member 213 is provided or located on the light extracting side of the light-emitting panel (light-emitting-device group) so that the display apparatus is generated.

Figure 20:
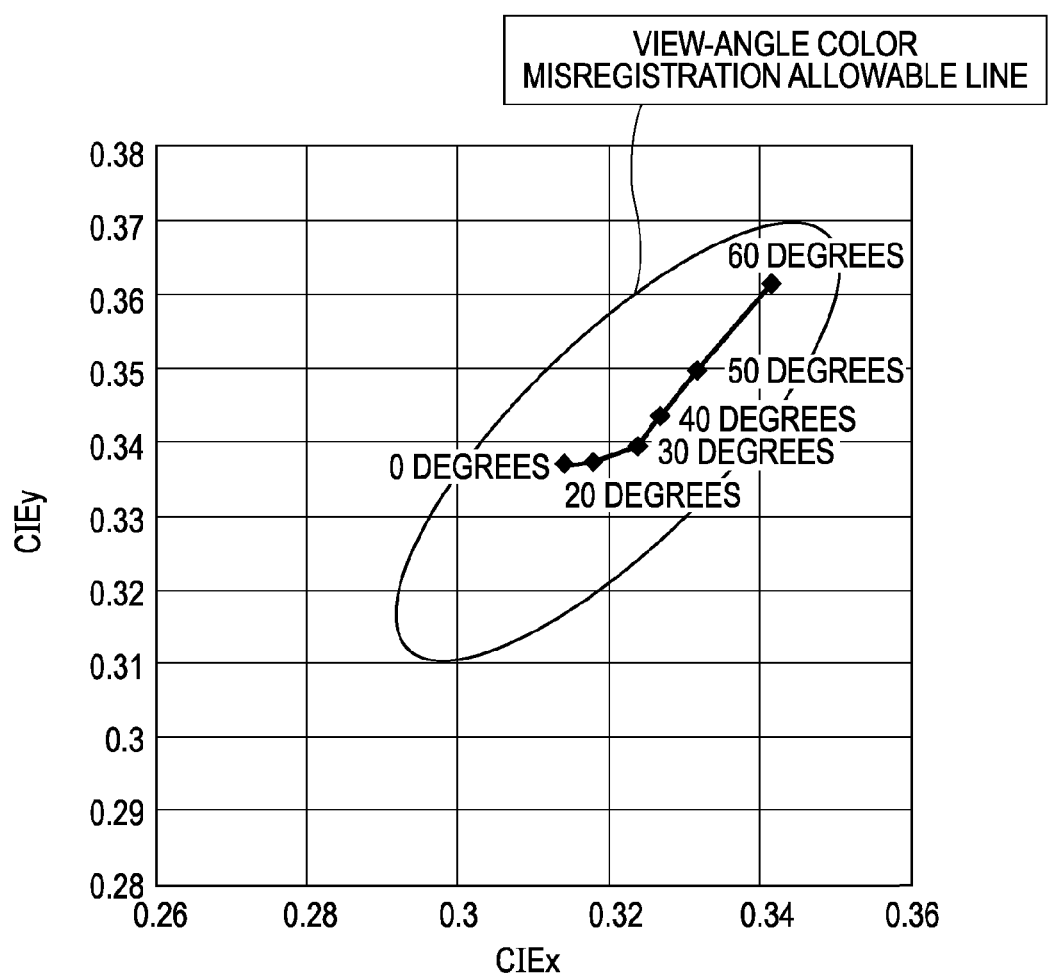
FIG. 20 is a chromaticity coordinate diagram showing the view angle property of the display apparatus according to the fourth embodiment.

FIG. 20 shows the view angle properties of the display apparatus according to the above-described embodiment. The above-described view angle properties indicate that the color of emitted light is changed in the yellow direction as the view angle direction is inclined. The result of the sensory evaluation shown in FIG. 2 indicates that the values of the view-angle properties obtained in the range of from zero degrees to sixty degrees fall within the range of allowable color misregistration. The above-described information reveals that the display apparatus according to the above-described embodiment can obtain view-angle properties appropriate for the human visual property.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-141058 filed on May 29, 2008, which is hereby incorporated by reference herein in its entirety.

What is claimed is:

1. A display apparatus comprising:
   a plurality of light emitting element groups including light emitting elements emitting lights of different colors,
   wherein each of the light emitting elements includes a first electrode, a second electrode, a light emitting layer arranged between the first and second electrodes, and an optical path between a first reflection plane located near the first electrode and a second reflection plane located near the second electrode is set so that light emitted through the light emitting layer is resonated,
   wherein a member configured to absorb a predetermined wavelength range for light emitted in a direction having an angle other than zero degree with respect to a normal direction of the display apparatus is commonly arranged on a light extracting side of the plurality of light emitting element groups,
   wherein the member has an angle dependence such that the larger the angle becomes the lower a transmittance becomes in the predetermined wavelength range, and
   wherein the predetermined wavelength range is set so that a hue of light emitted in the direction having the angle becomes yellow when the light-emitting-element group emits white light.

2. The display apparatus according to claim 1, wherein the member includes a light transmission part through which incident light is passed and a color absorbing part to absorb the predetermined wavelength range of the incident light.

3. The display apparatus according to claim 2 herein the light transmission part is on a light extracting side of the light emitting elements, and the color absorbing part is on a light extracting side between the light emitting elements.

4. The display apparatus according to claim 1,
   wherein the member includes a first polarization member, a retardation member, and a second polarization member that are sequentially arranged on a light extracting side of the light emitting element group.

5. The display apparatus according to claim 4,
   wherein a λ/4 retardation member is arranged between the first polarization member and the light emitting element group.

6. The display apparatus according to claim 1,
   wherein the member is a member in which at least one dichromatic dye is oriented in the normal direction.

* * * * *